United States Patent [19]
Brenn et al.

[11] Patent Number: 5,994,029
[45] Date of Patent: Nov. 30, 1999

[54] DULLED RADIATION-SENSITIVE RECORDING MATERIAL AND PROCESS FOR ITS PRODUCTION

[75] Inventors: Guenter Brenn, Erlangen; Franz Durst, Langensendelbach; Andreas Elsaesser, Idstein; Otfried Gaschler; Guenter Hutzsch, both of Wiesbaden; Klaus Joerg, Ingelheim, all of Germany

[73] Assignee: Agfa-Gevaert AG, Germany

[21] Appl. No.: 09/050,004

[22] Filed: Mar. 30, 1998

Related U.S. Application Data

[63] Continuation of application No. 08/711,475, Sep. 6, 1996, abandoned.

[30] Foreign Application Priority Data

Sep. 7, 1995 [DE] Germany .......................... 195 33 021

[51] Int. Cl.⁶ ...................................... G03F 7/11
[52] U.S. Cl. .................. 430/273.1; 430/327; 430/950
[58] Field of Search .............. 430/271.1, 273.1, 430/327, 950

[56] References Cited

U.S. PATENT DOCUMENTS

| | | |
|---|---|---|
| 3,790,079 | 2/1974 | Berglund et al. . |
| 4,216,289 | 8/1980 | Oda et al. ............................... 430/302 |
| 4,288,521 | 9/1981 | Kojima et al. ......................... 430/169 |
| 4,288,526 | 9/1981 | Oda et al. ............................... 430/950 |
| 4,842,982 | 6/1989 | Seibel et al. ............................ 430/950 |
| 5,006,442 | 4/1991 | Cooper et al. ......................... 430/271.1 |
| 5,576,137 | 11/1996 | Frass et al. ............................. 430/950 |

FOREIGN PATENT DOCUMENTS

| | | |
|---|---|---|
| 0344985 | 12/1989 | European Pat. Off. . |
| 0429234 | 5/1991 | European Pat. Off. . |
| 0649063 | 4/1995 | European Pat. Off. . |
| 19 36 518 | 4/1970 | Germany . |
| 26 06 793 | 9/1976 | Germany . |
| 30 03 131 | 8/1980 | Germany . |
| 31 31 570 | 8/1980 | Germany . |
| 20 81 919 | 2/1982 | Germany . |
| 44 41 553 | 6/1995 | Germany . |
| 1278645 | 6/1972 | United Kingdom . |
| 2118862 | 11/1993 | United Kingdom . |

OTHER PUBLICATIONS

VDI Guidelines, No. 3491, Section 3.3.7, pp. 1–9, Sept. 1980.

*Primary Examiner*—Christopher G. Young
*Attorney, Agent, or Firm*—Foley & Lardner

[57] ABSTRACT

The invention relates to a sheet-like radiation-sensitive recording material whose surface is a discontinuous dulling layer comprising monodisperse particles is present. The dulling layer can be produced by spraying on a dulling liquid. An apparatus comprising an oscillation generator, which can transmit oscillations to the liquid in the apparatus, and has an orifice plate which has at least one hole with a diameter of from 5 to 250 μm and from which the liquid emerges in the form of at least one laminar free jet which disintegrates into monodisperse drops is suitable for this purpose. The oscillation generator is preferably a piezoelectric ceramic.

22 Claims, 2 Drawing Sheets

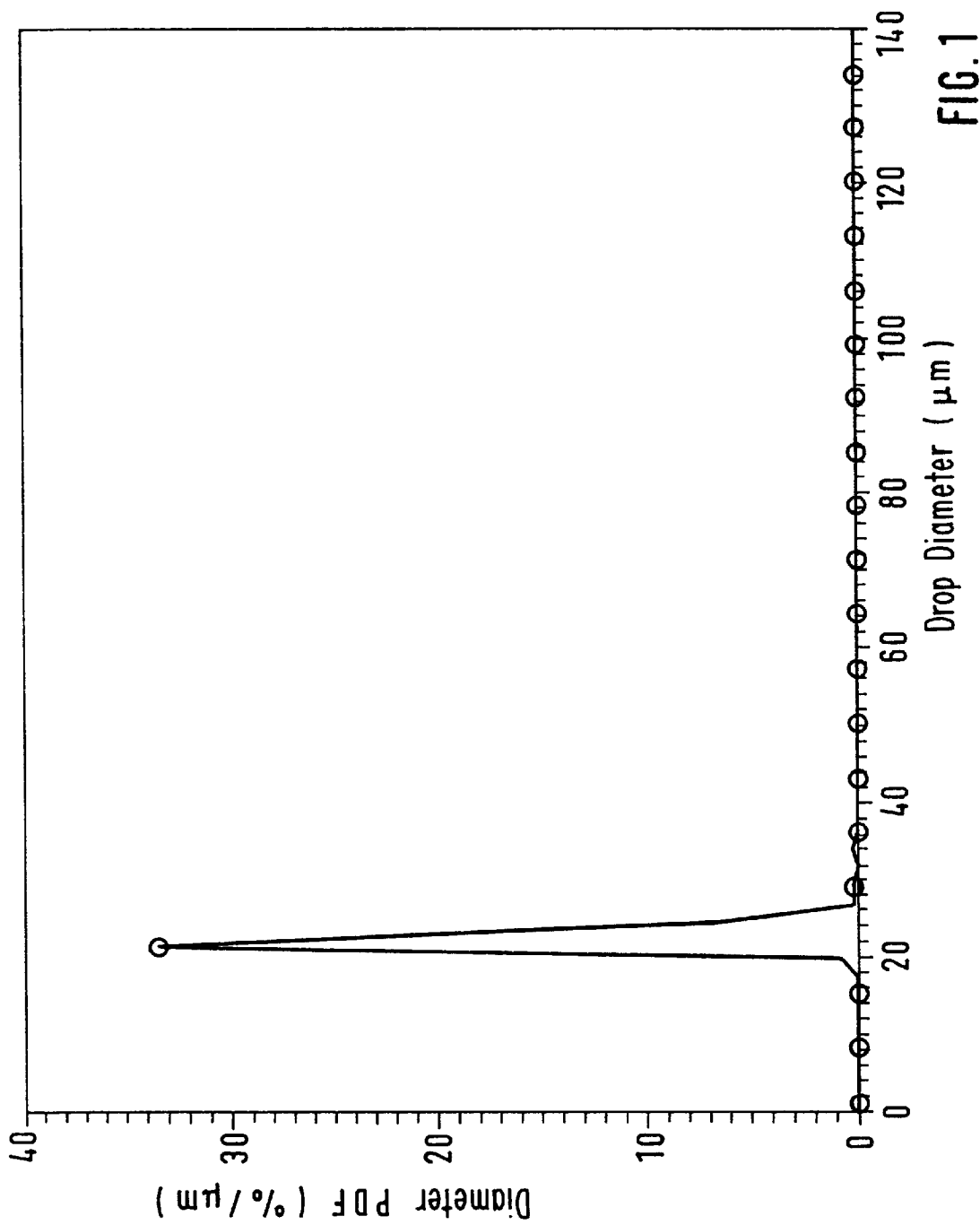

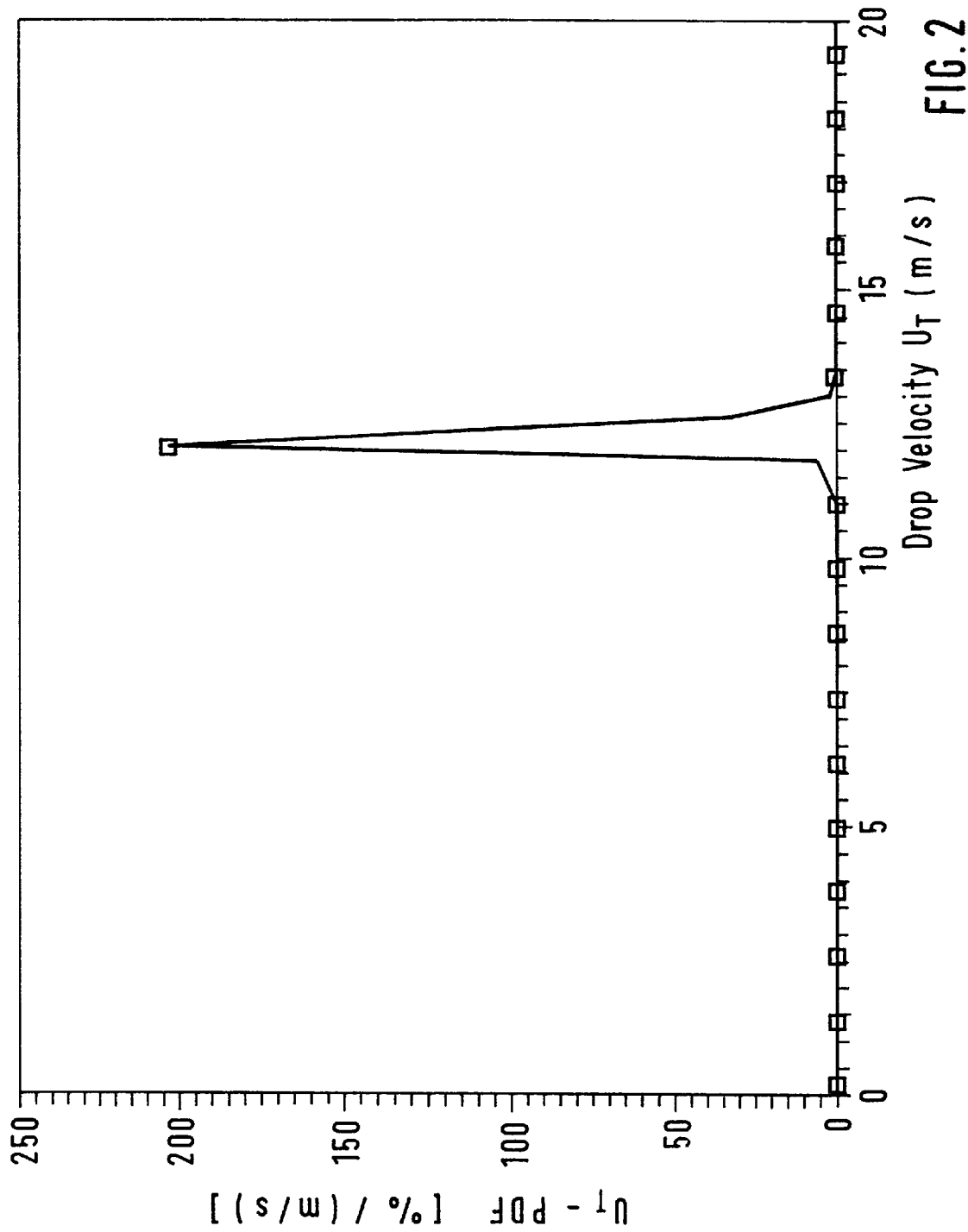

though, the height, diameter and
DULLED RADIATION-SENSITIVE RECORDING MATERIAL AND PROCESS FOR ITS PRODUCTION This application is a continuation, or continuation-in-part of application Ser. No. 08/711,475, filed Sep. 6, 1996, now abandoned.

BACKGROUND OF THE INVENTION

1) Field of the Invention

The invention relates to sheet-like radiation-sensitive recording materials. More specifically, the present invention is directed to sheet-like radiation sensitive recording materials providing with an image in a contact printing process, and on whose surface a discontinuous dulling layer is present, and a process for applying the dulling layer.

2) Description of Related Art

Dulling layers are conventionally used, in particular, in contact printing processes. In these processes, the original is placed directly on the radiation-sensitive recording material, usually in a so-called vacuum contact printing frame. The direct contact between original and recording material is produced by sucking out the air present in between. In the case of very smooth surfaces, it generally takes a long time before a constant vacuum is reached. In addition, air occlusions may remain behind, leading to sidelighting. Many recording materials also contain compounds which undergo a chemical reaction on exposure to radiation and evolve gases, for example nitrogen. The removal of such gases also presents problems in the case of smooth surfaces.

These disadvantages can be substantially avoided if copying materials having a rough surface are used. Such a surface can be achieved, for example, by dusting the radiation-sensitive layer with a finely divided powder. However, as a rule this leads to a nonuniform roughness. Moreover, the powder may become detached from the surface and contaminate the vacuum pump.

A rough surface is also obtained if the recording material is embossed with a roller.

Inorganic or organic particles of a certain size which may be added to the solution or dispersion which serves for the production of the radiation-sensitive layer project from the finished layer after drying and likewise result in a rough surface. If these particles are present in the printing layer, the term "micro-pigmentation" is used; however, if they are on the copying layer, the term "dulling" is used.

Dulling layers can be divided into those which completely cover the surface (=continuous dulling layers) and those which only partly cover the surface (=discontinuous dulling layers). The discontinuous layers frequently comprise more or less hemispherical protuberances (="culottes").

DE-A 30 03 131 (=U.S. Pat. No. 4,288,521) discloses dusting with the aid of a cyclone and subsequent thermal or chemical fixing of solid dulling agents for producing discontinuous layers.

According to DE-A 26 06 793 (=U.S. Pat. No. 4,216,289), dulling is possible by applying a coating solution via an embossing roll to a coating roll which comprises resilient material having a fine, uneven pattern. From this coating roll, the coating solution is then transferred to a support.

DE-A 31 31 570 (=GB-A 2 081 919) discloses that an aqueous liquid which contains a resin in dissolved or dispersed form can be sprayed on. Spraying can be supported by applying an electrostatic voltage of at least 5 kV (EP-A 0 344 985, EP-A 0 649 063).

In all these processes, however, the height, diameter and number of dulling particles per unit area are subject to certain fluctuations, so that the behavior during contact imaging—i.e., placing a positive or negative master in a vacuum contact frame on the dulled radiation-sensitive layer, evacuating the frame and irradiating through the master—is not reliably reproducible.

SUMMARY OF THE INVENTION

One object of the present invention is to provide dulling layers which overcome the problems of the art described above.

Another object of the present invention is to provide a recording material having a dulling layer made of monodisperse particles and a process for producing the same.

These and other objects are achieved according to one aspect of the present invention which includes a sheet-like radiation-sensitive recording material comprising a discontinuous dulling layer on a surface of the recording material, wherein the dulling layer comprises monodisperse particles.

According to another aspect of the present invention, there has been provided a process for the production of a discontinuous dulling layer on a recording material, which comprises spraying a dulling liquid in the form of monodisperse drops onto a surface of the recording material.

Further objects, features and advantages of the present invention will become apparent to those skilled in the art from consideration of the detailed description of preferred embodiments which follows.

BRIEF DESCRIPTION OF THE DRAWINGS

FIG. 1 depicts the distribution of the diameter ($d_p$) of drops according to one embodiment of the present invention.

FIG. 2 depicts the associated distribution of the velocities ($V_t$) of the drops according to one embodiment of the original invention.

DETAILED DESCRIPTION OF THE PREFERRED EMBODIMENTS

The present invention includes spraying on a solution or dispersion of a resin in the form of monodisperse drops. "Monodisperse" means that the drops are generally essentially of equal size, i.e., the liquid spray does not have a broad drop distribution. Furthermore, the velocity at which the drops move toward the surface is preferably substantially identical for all drops., as is diagrammatically shown in FIG. 2. This means, in particular, that the velocity of the fastest drop is not more than 10% higher than the average velocity, and the velocity of the slowest drop is not more than 10% inferior to the average velocity. Accordingly, the dulling particles ("culottes") which are formed, after drying, from the drops sprayed onto the surface are of essentially the same size. "Monodisperse" in the mathematical sense means a group of particles having the distribution width of zero. In contrast, all other groups of particles are "polydisperse". In reality, however, there are no mathematically monodisperse groups of particles including the particles of the present invention. In practice, it is therefore usual to define a group of particles, whose mean diameters differ from one another by less than 10%, as "monodisperse" (VDI Guidelines, No. 3491 [1980], Section 3.3.7 which are incorporated herein in their entirety). This definition is also intended to apply in a preferred embodiment of the present application.

The present invention thus relates to a sheet-like radiation-sensitive recording material which is provided with an image in a contact printing process and on whose surface a discontinuous dulling layer is present. In the recording material, the dulling layer comprises monodisperse particles with monodisperse defined as above. The particles are furthermore preferably arranged on the surface at substantially identical distances from one another.

The monodisperse particles of the dulling layer ensure, on the one hand, that the positive or negative master can be brought into close, uniform contact with the radiation-sensitive layer, without side-lighting. On the other hand, the contact created is not close enough to cause blocking.

As a rule, the recording material is generally in the form of plates, films or tapes. It comprises, in general, a support which may comprise metal, plastic or another material, and a radiation-sensitive layer. Radiation-sensitive recording materials having a support comprising a metal foil or plastics film, preferably an aluminum foil or polyester film, on which a radiation-sensitive layer is present, are particularly preferred. However, any desired radiation-sensitive layer is useful. In the latter case, the discontinuous, monodisperse dulling layer may be present on the radiation-sensitive layer as well as on the uncoated back of the plastics film. However, it is then essential that the plastics film support is transparent to the radiation having an imagewise effect. The discontinuous dulling layer comprising the monodisperse particles is arranged on that side of the recording material which comes into contact with the image-bearing original.

The recording material is, for example, a blueprint material or a vesicular film (vesicular films are used, for example, for microfilm duplication). Further examples are recording materials from which color proofing films for multicolor printing or printing plates can be produced. The dulling layer according to the invention ensures closer, more uniform contact between the film original and the recording material. In addition, the dulling prevents undesired adhesion (blocking) of the film original against the recording material. Blocking is a problem which occurs generally in the case of smooth films.

The present invention also relates to a process for the production of the dulled recording materials according to the invention, which comprises spraying on a dulling liquid in the form of monodisperse drops. Usually, drying is also carried out after the spraying procedure. Drying is generally effected for example, in a convection dryer or by exposure to infrared radiation.

An apparatus by means of which the dulling material of the recording material according to the invention can be sprayed on is described in DE-A 44 41 553 the disclosure of which is incorporated by reference herein in its entirety. It operates according to the principle of controlled disintegration of liquid jets. Gas bubbles in the liquid in the apparatus can lead to malfunctions and should therefore, be removed. In the liquid column in the apparatus, longitudinal oscillations are generated. The frequency of these oscillations is preferably from 1 to 200 kHz, particularly preferably from 2 to 150 kHz. The oscillations are advantageously generated with the aid of a piezoelectric ceramic. The oscillations result in periodic pressure fluctuations in the liquid column. The liquid finally emerges through the hole(s) in an orifice plate in the form of free laminar jets, which then disintegrate into a chain of monodisperse drops as a result of the periodic fluctuations. The orifice plate accordingly has one or more fine hole(s) with a diameter (d) of, in each case, generally from 5 to 250 $\mu$m, preferably from 10 to 100 $\mu$m. These holes are preferably formed using laser tools. The individual holes should as far as possible all have the same diameter. The frequency (f) of the longitudinal oscillations in the drop generator must be adapted to the velocity (U) at which the liquid flows out, as well as to the diameter (d) of the outlet holes. In the case of a diameter (d) of the hole(s) of 10 $\mu$m, the frequency is preferably in the range from 40 to 130 kHz. The liquid jets must be unstable with respect to the applied oscillations (="interference waves"). For this purpose, the length of the interference waves must be longer than the circumference of the liquid jet immediately after emerging from the hole.

The diameter ($d_p$) of the drops is dependent on the frequency and can thus be adjusted. The diameter ($d_p$) can be calculated from the volume flow (Q) of the outflowing liquid and the frequency (f) of the applied interference waves with the aid of the equation $d_p=(6Q/\pi \cdot f)^{1/3}$. The formation of (undesired) smaller satellite drops between the equidistant main drops can also be prevented by a suitable choice of the frequency. The frequency can be easily adapted by those skilled in the art.

Impurities in the liquid may lead to blockage of the holes in the orifice plate. An appropriately fine filter is therefore expediently placed upstream. If the liquid was filtered through a membrane having a pore diameter of not more than 1.2 $\mu$m, it is also possible to use an orifice plate having microholes of 10 $\mu$m diameter without blockages being expected. The apparatus can be used for forming solutions as well as dispersions into mono-disperse drops. The dispersions may preferably contain particles up to a diameter of a few hundred nanometers.

The angle of inclination ($\alpha$) between the free laminar jet and the normal of the surface to be dulled is generally between 0 and less than 90°, preferably between 0 and 80°. This means that the drops need not always strike the surface perpendicularly ($\alpha=0$) but may also strike obliquely.

The velocity and diameter of the drops can be determined with the aid of a phase Doppler anemometer (PDA). The scattered light signals which are emitted by the drops on passage through the point of intersection of two laser beams are used therein. A proviso is that the drops are spherical. This condition is fulfilled if the Ohnesorge number (Oh) is 0.01 or greater. The laminar liquid jets have then disintegrated into a chain of monodisperse, spherical drops only a few centimeters after leaving the orifice plate (1). The Ohnesorge number (Oh) is a function of the dynamic viscosity ($\mu$), of the surface tension ($\sigma$) and of the density ($\rho$) of the liquid, according to the formula $Oh=\mu/(\sigma \cdot d_p \cdot \rho)^{0.5}$.

The distribution of the diameter ($d_p$) of drops produced from a dispersion having a solids content of 25% and an orifice plate having 10 $\mu$m holes at a frequency of 124.1 kHz and a flow rate (Q) of 0.099 ml/min is shown in FIG. 1. The mean drop diameter ($D_{10}$) is 22.8 $\mu$m in the Example.

The associated distribution of the velocities ($U_T$) of the individual drops is shown in FIG. 2. The mean velocity ($U_{mean}$) is 12.3 m/s.

The Figures clearly show that the scatter about the mean value is very small in each case.

The frequency range is predetermined by the position and width. It varies with the quotient U/d. It is not possible to choose the drop diameter ($d_p$) independently of the flow rate (Q) of the liquid. However, depending on the width of the frequency range, the diameter ($d_p$) can be varied by changing the frequency by up to ±20%.

Tape-like recording materials are frequently passed at a tape velocity ($U_b$) through the drop generator. The drops then strike at a distance ($\delta_T$), which is determined by the frequency (f) and the tape velocity ($U_b$), according to the equation $\delta_T = U_b/f$. A smaller distance ($\delta_T$) denotes a higher coating density. If the drop distance is to be, for example, 300 μm, a frequency of 3.3 kHz would be required according to the above equation at a tape velocity ($U_b$) of 1 m/s. Higher frequencies lead to smaller drop distances and hence to a denser coating. The drop generator must consequently be moved back and forth over the tape-like element in the tape-running direction or transverse thereto in order to achieve this drop distance. The drop distance can moreover be influenced by the superposition of rotary movements.

If broad tape-like recording materials (possibly several meters) are to be dulled, correspondingly broad orifice plates in which the microholes are arranged in rows are expediently used. The distance between the holes depends on the particular type of dulling desired. The holes must generally be uniformly supplied with liquid over the total width so that the same pressure and volume flow are preferably present at all holes. This can be achieved by a distribution chamber. In this embodiment of the drop generator, the excitation by means of the oscillation generator can be effected directly in the liquid above the distribution chamber. The drop generator disclosed in DE-A 44 41 553 can likewise be used for broad, tape-like elements. However, in many embodiments it must then be arranged in a mobile manner in order to ensure uniform coating with the drops. Here, the drop generator will execute a scanning movement. Although the above description has been with reference to a preferred drop generator, any type of drop generator or spray apparatus capable of producing monodisperse particles can be used according to the present invention.

The recording materials according to the invention have an extremely uniform dulling. This applies both to the distance and to the height and the diameter of the dulling particles. Extensive halftone areas are also exactly transferred—even under critical conditions—without there being any significant sidelighting. In this case, the dulling particles generally have a height of, preferably, not more than 10 μm. At a height of more than 10 μm, the reproduction of fine drawings of the film original may be impaired; however, when fine drawings are not used, heights of greater than 10 μm are acceptable. In every square centimeter of the recording material, there are preferably about 100 to 10,000 culottes at a uniform distance of preferably 1,000 to 100 μm.

The solution or dispersion from which the monodisperse drops are produced contains in general from 0.5 to 50% by weight, preferably from 5 to 40% by weight, based on its total weight, of solid. The solids content depends on the type of solvent or on the type of continuous phase (in the case of the dispersion), on the distance which the monodisperse drops have to cover, on the ambient temperature, on the diameter of the microhole(s), on the frequency of the oscillation generator and on the desired size of the dulling particles. The boiling point of the solvent or of the continuous phase is preferably from about 40 to 250° C. In addition to water, organic solvents, such as aliphatics, aromatics, ketones (e.g. acetone), ethers (e.g. tetrahydrofuran), glycol ethers (in particular ethylene glycol mono($C_1$–$C_4$)alkyl ether, ethylene glycol di($C_1$–$C_4$)alkyl ether, propylene glycol mono($C_1$–$C_4$)alkyl ether or propylene glycol di($C_1$–$C_4$) alkyl ether) or polar aprotic solvents (e.g. N-methylpyrrolidone, dimethylformamide, gamma-butyrolactone or dimethyl sulfoxide), are also suitable.

The solid contains, as a rule, an organic polymer, such as a resin. The polymer preferably has a glass transition temperature of at least 40° C., in order to avoid undesired adhesion during the subsequent processing. Polycondensates, such as polyesters, polyamides, polyurethanes or polyureas, are particularly suitable. Polymers, in particular homo- and copolymers, having units of acrylates or methacrylates, vinylaromatics, vinyl ethers, vinyl alcohols, vinyl acetals and vinylamides, are also suitable.

The size of the monodisperse particles depends on the size of the drops and on their solids content.

Radiation-sensitive recording materials, in particular those for the production of offset printing plates, are generally developed with an aqueous alkaline developer after the imagewise exposure to radiation. To ensure that the developer simultaneously also removes the dulling layer, resins which contain acid and/or salt groups are preferably used. The salts are generally sodium, potassium, ammonium, calcium, zinc or aluminum salts. The resins preferably contain from 0.03 to 0.75 mmol/g of acid and/or salt groups. Such resins are described in EP-A 0 649 063 incorporated herein by reference.

In addition, the solution or dispersion may also contain surfactants—in particular anionic and/or nonionic ones—which influence the wetting behavior on the surface of the recording material. Suitable surfactants include long-chain alkyl alcohol ethoxylates, alkylphenol ethoxylates or sulfonates, sulfates, carboxylates or phosphonates of, optionally ethoxylated, long-chain alkyl alcohols or alkyl phenols.

The Examples which follow are intended to illustrate the invention in more detail without restricting it. Unless stated otherwise, the amounts are stated in parts by weight (pbw). The angle of inclination (α) is zero for all Examples.

EXAMPLE 1

(Drying of Developable Color Proof Material)

50 μm thick, biaxially stretched and heat-set polyester films (®Melinex 505) pretreated on both sides with an adhesion-promoting material were each coated with one of the following four radiation-sensitive mixtures:

|  | Cyan | Magenta | Yellow | Black |
|---|---|---|---|---|
| Dipentaerythrityl pentacrylate | 19.9 | 25.0 | 21.6 | 19.9 |
| 2,3-Bis (4-methoxy-phenyl)quinoxaline | 5.1 | 6.1 | 5.4 | 5.3 |
| Polyvinyl formal | 16.3. | 23.0 | 18.4 | 14.2 |
| Polyether-modified polysiloxane* | 0.2 | 0.2 | 0.2 | 0.2 |
| Hostaperm blue B2G (C.I. 74160) | 9.7 | — | — | — |
| Permanent Red FBB (C.I. 12485) | — | 12.9 | — | — |
| Permanent Yellow (C.I. 21100) | — | — | 8.6 | — |
| Carbon black (® Printex 25) | — | — | — | 13.6 |
| Tetrahydrofuran | 398.6 | 363.9 | 382.4 | 378.8 |
| Diacetone alcohol | 113.9 | 121.3 | 124.3 | 123.1 |
| 1-Methoxy-2-propanol | 360.6 | 326.5 | 353.7 | 331.5 |
| gamma-Butyrolactone | 75.9 | 121.3 | 86.0 | 113.6 |

*having a molecular weight $M_w$ of 6500, determined by gel permeation chromatography (GPC).

The pigments were dispersed with a part of the binder and of the butyrolactone. The particle size was less than 200 nm.

The weight of the applied layer was about 0.7 g/m² after drying at 110° C. In each case, a solution of 50 pbw of vinyl acetate/crotonic acid copolymer (95/5),

| 50 pbw | of vinyl acetate/crotonic acid copolymer (95/5), |
| --- | --- |
| 252 pbw | of water, |
| 24 pbw | of ethanol and |
| 5 pbw | of 25% strength by weight aqueous ammonia solution | was then applied to the dried radiation-sensitive layer, and drying was carried out at 100° C. to form an adhesion promoting layer. The weight of the adhesion-promoting layer thus applied was then 6 g/m². Finally, a transparent protective film was furthermore laminated to this adhesion-promoting layer.

In each case, half the back of the film support was then provided with a discontinuous dulling layer according to the invention. The other half remained undulled for comparison purposes.

Dulling was effected with an aqueous dispersion having a solids content of about 20% by weight. The solids content essentially comprised a copolymer of 80% by weight of vinylidene chloride, 5% by weight of acrylonitrile, 12% by weight of methyl methacrylate and 3% by weight of acrylic acid.

The dispersion was stabilized with dodecyl benzenesulfonate. The dynamic viscosity ($\mu$) of the dispersion was 3 mPa.s, its density ($\rho$) was 1.1 g/ml and its surface tension was 43 mN/m.

The drop generator was guided in a scanning movement over the films. The orifice plate of the drop generator had a diameter of 10 $\mu$m. The dispersion was excited in the drop generator at a frequency of 39.7 kHz. The mean drop diameter ($D_{10}$) was 40.2 $\mu$m, the distance ($\delta_T$) between the culottes on the film surface was 200 $\mu$m, the maximum height of the culottes above the film surface was 3 $\mu$m and the diameter (s) of the culottes was 75 $\mu$m.

Processing of the Color Proofing Films

After the protective film had been peeled off, the color film was laminated with plastic-coated special paper at 85° C. and exposed under a positive film having a 60-line screen and 20% area coverage in a contact printer. After the film support had been peeled off at an angle of 180°, the corresponding color proof was obtained. The same result was obtained in the case of all 4 colors: the half which had been exposed through the dulled film support exhibited uniform halftone reproduction, whereas a clearly nonuniform halftone image was detectable in the other half which had been exposed through the undulled film support.

EXAMPLE 2

(Vesicular Film Material)

An adhesion-promoting layer was applied to a 125 $\mu$m thick, biaxially stretched and heat-set, transparent polyethylene terephthalate film by applying a solution of

| 1.15 pbw | of a linear, saturated polyester containing hydroxyl groups (® Dynapol LH 812), |
| --- | --- |
| 0.65 pbw | of vinylidene chloride/acrylonitrile copolymer (70/30) ( ®Saran F310) and |
| 98.2 pbw | of methyl ethyl ketone | to the film and carrying out drying at 110° C. The weight of the adhesion-promoting layer was then about 0.25 g/m².

A solution of

| 12.7 pbw | of vinylidene chloride/acrylonitrile copolymer (30/70), |
| --- | --- |
| 3.3 pbw | of vinylidene chloride/acrylonitrile copolymer (80/20), |
| 0.8 pbw | of 2,5-diethoxy-4 morpholinobenzenediazonium tetrafluoroborate, |
| 0.7 pbw | of citric acid, |
| 0.3 pbw | of sodium dioctyl sulfosuccinate and |
| 83.0 pbw | of methyl ethyl ketone | was then applied to the dried adhesion-promoting layer and drying was carried out at 100° C. to form a radiation-sensitive layer. The weight of the radiation-sensitive layer thus obtained was 6 g/m². A discontinuous dulling layer according to the invention was then sprayed onto one half of this layer. A dispersion having a solids content of 10% by weight, a dynamic viscosity ($\mu$) of 2.5 mPa.s, a density ($\rho$) of about 1 g/ml and a surface tension ($\sigma$) of 38 mN/m was used for this purpose. The solid comprised a methacrylic acid/styrene/ethyl acrylate terpolymer having a methacrylic acid content of 4.6% by weight and a glass transition temperature ($T_g$) of about 75° C., dispersed in water as a zinc ammonia complex salt. The size of the particles in the dispersion was less than 100 nm.

The drop generator was guided in a scanning movement over the film. The diameter of the hole in the orifice plate (d) was 10 $\mu$m, the frequency (f) was 100 kHz, the mean drop diameter ($D_{10}$) was 26 $\mu$m, the distance between the culottes on the film ($\delta_T$) was 100 $\mu$m, the height of the culottes (h) was 2 $\mu$m and their diameter (s) was 40 $\mu$m.

Processing of the Vesicular Film

After exposure under a 60-line halftone negative having 20% surface coverage by the contact method, the material was heated to 130° C. for development. In the film half exposed through the dulling layer, the halftone image was homogeneously reproduced. In the other half, on the other hand, the halftone area was inhomogeneous. When viewed in transmitted light, it showed clear differences in transmission.

EXAMPLE 3

(Blueprint Material)

A solution of

| 0.234 pbw | of a polyester of terephthalic acid, neo-pentyl glycol and ethylene glycol, having a weight average molecular weight $M_w$ of 19,000 (determined by GPC), |
| --- | --- |
| 10.0 pbw | of an ester of cellulose, acetic acid and propionic acid (3.5% of the hydroxyl groups of the cellulose were esterified with acetic acid and 45% with propionic acid), |
| 0.13 pbw | of vinylidene chloride/acrylonitrile copolymer (80/20) and |
| 240 pbw | of ethylene glycol monomethyl ether | was applied to a 175 $\mu$m thick biaxially stretched and heat-set, transparent polyethylene terephthalate film, and drying was carried out at 120° C. The weight of the adhesion-promoting layer thus produced was about 3 g/m².

A solution of

| | |
|---|---|
| 3.5 pbw | of the abovementioned cellulose acetate propionate, |
| 1.3 pbw | of 2-hydroxy-N-(2-hydroxyethyl)naphthalene-3-carboxamide, |
| 2.3 pbw | of 2,5-dibutoxy-4-morpholinobenzenediazonium tetrafluoroborate, |
| 0.1 pbw | of 2-hydroxy-5-sulfobenzoic acid (= sulfosalicylic acid), |
| 0.05 pbw | of polyether-modified polydimethylsiloxane (® Edaplan LA 411), |
| 30 pbw | of ethylene glycol monomethyl ether and |
| 120 pbw | of tetrahydrofuran | was then applied to the adhesion-promoting layer, and drying was carried out at 105° C. The weight of the radiation-sensitive layer thus produced was 7.5 g/m2.

One half of the radiation-sensitive recording material was then provided with a discontinuous dulling according to the invention. For this purpose, a dispersion of a styrene/butyl acrylate/sodium ethylenesulfonate terpolymer (70/24.4/5.6% by weight) in water, having a solids content of about 20% by weight, a dynamic viscosity ($\mu$) of 4.5 mPa.s, a density ($\rho$) of about 1 g/ml and a surface tension ($\sigma$) of 41 mN/m was sprayed on by means of the drop generator. The drop generator, whose orifice plate had a hole with a diameter of 10 $\mu$m and which was operated at a frequency of 45 kHz, delivered monodisperse drops having a diameter $D_{10}$ of 38 $\mu$m. It was guided in a scanning movement over the film. In this way, monodisperse culottes having a mean height (h) of 3 $\mu$m, a mean diameter (s) of 70 $\mu$m and a mean distance ($\delta_T$) from one another of 200 $\mu$m were applied to the surface of the radiation-sensitive layer.

Processing of the diazo type films: After exposure under a 60-line halftone positive having 20% area coverage by the contact method, development was effected in the dry state with (gaseous) ammonia. As in Examples 1 and 2, in this case too only the half which had been exposed through the dulling layer showed uniform halftone reproduction.

EXAMPLE 4
(Offset Printing Plate)

A 0.3 mm thick aluminum foil electrolytically roughened ($R_z$ value according to DIN 4768:5.0 $\mu$m) in hydrochloric acid, pickled in sulfuric acid and then anodized in sulfuric acid (oxide weight 4.0 g/m²) was hydrophilized with polyvinylphosphonic acid and then coated with a solution of

| | |
|---|---|
| 5.00 pbw | of a cresol/formaldehyde novolak having a hydroxyl number of 420 according to DIN 53783/53240 and a weight average molecular weight $M_w$ of 10,000 (determined by GPC with polystyrene standard), |
| 1.20 pbw | of an ester of 3 mol of 2-diazido-1,2-naphthoquinone-5-sulfonyl chloride and 1 mol of 2,3,4-trihydroxybenzophenone, |
| 0.15 pbw | of 2-diazido-1,2-naphthoquinone-4-sulfonyl chloride, |
| 0.05 pbw | of Victoria Sky Blue (C.I. 44 045) and |
| 0.005 pbw | of polyether-modified polydimethylsiloxane (®Edaplan LA) and |
| 93.595 pbw | of a mixture of methyl ethyl ketone and propylene glycol monomethyl ether (40/60) | and drying was carried out for 1 minute at 125° C. The weight of the radiation-sensitive layer thus produced was 2.4 g/m².

The recording material thus produced was then cut into 3 parts. Part A was not further treated, whereas Parts B and C were dulled, dulling being effected with a dispersion which contained 20% by weight of solid dispersed in water. The solid was essentially a methacrylic acid/methyl methacrylate/ethyl acrylate terpolymer having a methacrylic acid content of 4.6% by weight based on the total weight of the polymer. The dispersion was stabilized with the sodium salt of nonyl-phenol-octaglycolsulfonic acid (this conventionally used name is not in full accordance with the IUPAC nomenclature rules. The structural formula of the compound is $H_3C-(CH_2)_8-C_6H_4-(O-CH_2-CH_2)_8-O-SO_3Na$, i.e., it is actually a sulfate rather than a sulfonate). The dispersion had a dynamic viscosity ($\mu$) of 3.0 mPa.s, a density ($\rho$) of about 1 g/ml and a surface tension ($\sigma$) of 39 mN/m.

The dispersion was sprayed onto Part B in a known manner described in EP-A 0 649 063 by means of an atomizing bell rotating at high speed ("high-speed bell") with electrostatic support. An atomizing bell having a diameter of 6 cm and a speed of 20,000 revolutions per minute was used. The distance between the atomizing bell and the surface of the recording material was 15 cm. An electrostatic potential difference of 40 kV was present between bell and recording material. The discontinuous dulling layer thus produced was then dried with infrared radiation.

Each square centimeter of the dulling layer had on average 2,300 culottes whose mean height was 4 $\mu$m and whose maximum height was 9 $\mu$m. The mean diameter of the culottes was 35 $\mu$m and the maximum diameter 70 $\mu$m. The dulling was thus not "monodisperse".

Part C was provided with the dulling according to the invention with the aid of the drop generator. The drop generator was guided in a scanning movement over the recording material. The diameter (d) of the hole in the orifice plate of the drop generator was 10 $\mu$m, the excitation frequency (f) was 100 kHz, the mean drop diameter ($D_{10}$) was 26 $\mu$m, the distance ($\delta_T$) between the culottes was 50 $\mu$m, the height of the culottes was 4⁻ $\mu$m and their diameter (s) was 40 $\mu$m. The dulling layer was dried as in the case of Part B.

After exposure under a 60-line halftone positive test original with 20% area coverage by the contact method, Parts A, B and C were developed in an immersion bath development apparatus in the course of 20 seconds with an aqueous alkaline developer which contained

| | |
|---|---|
| 0.45 mol/l | of $Na_2SiO_3$ |
| 10 g/l | of benzoic acid and |
| 1 g/l | of nonylphenol ethoxylate having an HLB value of 13 (HLB = hydrophilic-lipophilic balance), | in each case to give an offset printing plate.

A comparison of the three printing plates obtained in this manner gave the following result:

Plate A exhibited a highly nonuniform halftone image and was thus unsatisfactory.

Plate B showed less but still detectable halftone nonuniformity and was thus likewise still unsatisfactory.

Only on plate C was the halftone image homogeneously reproduced.

German Application No. 195 33 021.8 filed Sep. 7, 1995 (the priority document of the present application) is hereby incorporated in its entirety.

Other embodiments of the invention will be apparent to those skilled in the art from consideration of the specification and practice of the invention disclosed herein. It is intended that the specification be considered as exemplary only, with the true scope and spirit of the invention being indicated by the following claims.

What is claimed is:

1. A radiation-sensitive recording material comprising a discontinuous dulling layer on a surface of the recording material, wherein the dulling layer comprises monodisperse particles, and wherein the monodisperse particles have diameters which differ from one another by less than 10%.

2. A recording material as claimed in claim 1, wherein the discontinuous dulling layer comprising the monodisperse particles is arranged on a surface of the secondary material which comes into contact with an image-bearing original during imaging.

3. A recording material according to claim 1, wherein the monodisperse particles are coulettes which have a height of $\leq 10$ $\mu$m.

4. A recording material according to claim 4, wherein there are 100–1,000 coulettes at a uniform distance of 100–1,000 $\mu$m per cm$^2$ of recording material.

5. A recording material as claimed in claim 1, which further comprises a support and a radiation-sensitive layer or a surface of the support.

6. A recording material according to claim 5, wherein the support comprises metal or plastic.

7. A recording material as claimed in claim 5, wherein the support is an aluminum foil or a polyester film.

8. A process for the production of a discontinuous dulling layer on a recording material according to claim 1, which comprises spraying a dulling liquid in the form of monodisperse drops onto a surface of the recording material.

9. A process as claimed in claim 8, wherein the velocity of the fastest monodisperse drop is not more than 10% higher than the average drop velocity, and the velocity of the slowest drop is not more than 10% less than the average drop velocity.

10. A process as claimed in claim 8, wherein the dulling liquid is sprayed on with the aid of an apparatus comprising an oscillation generator which can transmit oscillations to the liquid in the apparatus and includes an orifice plate which has at least one hole with a diameter of from 5 to 250 $\mu$m and from which the liquid emerges in the form of at least one laminar free jet which disintegrates into monodisperse drops.

11. A process as claimed in claim 10, wherein the oscillation generator transmits an oscillation having a frequency of from 1 to 200 kHz to the liquid.

12. A process as claimed in claim 10, wherein the oscillation generator is a piezoelectric ceramic.

13. A process as claimed in claim 10, wherein the diameter of the individual hole is from 10 to 100 $\mu$m.

14. A process as claimed in claim 8, wherein the dulling liquid is a solution or dispersion.

15. A process as claimed in claim 14, wherein the boiling point of a solvent or of a continuous phase in the solution or dispersion is from about 40 to 250° C.

16. The process as claimed in claim 14, wherein the Ohnesorge number of the solution or dispersion is 0.01 or greater.

17. The process as claimed in claim 14, wherein the solution or dispersion contains from 0.5 to 50% by weight, based on its total weight, of solids.

18. A process as claimed in claim 14, wherein the solution or dispersion contains from 5 to 40% by weight, based on its total weight, of solids.

19. A process as claimed in claim 17, wherein the solids include an organic polymer.

20. A process as claimed in claim 17, wherein the solids include an organic polymer having a glass transition temperature of at least 40° C.

21. A process as claimed in claim 10, wherein the angle of inclination between the free jet and the normal of the surface to be dulled is between 0 and less than 90°.

22. A process as claimed in claim 8, wherein the dulling layer is dried after being sprayed on.

* * * * *